(12) United States Patent
Fletcher et al.

(10) Patent No.: US 6,773,281 B2
(45) Date of Patent: Aug. 10, 2004

(54) STRAIN RELIEF FOR FLEXIBLE CIRCUIT

(75) Inventors: Kevin Sean Fletcher, Boulder, CO (US); Richard W. Morris, Broomfield, CO (US)

(73) Assignee: Quantum Corporation, Milpitas, CA (US)

( * ) Notice: Subject to any disclaimer, the term of this patent is extended or adjusted under 35 U.S.C. 154(b) by 29 days.

(21) Appl. No.: 10/284,959

(22) Filed: Oct. 31, 2002

(65) Prior Publication Data

US 2004/0087204 A1 May 6, 2004

(51) Int. Cl.[7] .................................................. H01R 3/00
(52) U.S. Cl. .................................... 439/162; 360/98.01
(58) Field of Search ................................. 439/162, 456, 439/495, 470; 360/98.01, 97.01, 250, 255.2, 266.5, 266, 261.1; 174/254

(56) References Cited

U.S. PATENT DOCUMENTS

| | | | | |
|---|---|---|---|---|
| 5,519,554 A | * | 5/1996 | Todd et al. .............. 360/266.5 |
| 5,566,039 A | * | 10/1996 | Spicer ..................... 360/261.1 |
| 5,631,788 A | * | 5/1997 | Richards .................. 360/264.2 |
| 5,748,410 A | * | 5/1998 | Briggs et al. ............ 360/261.1 |
| 5,953,183 A | | 9/1999 | Butler et al. ............. 360/264.2 |
| 6,078,483 A | * | 6/2000 | Anderson ................. 360/261.1 |

* cited by examiner

Primary Examiner—Hae Moon Hyeon

(74) Attorney, Agent, or Firm—Patton Boggs LLP

(57) ABSTRACT

A flex circuit strain relief that routes and restrains flex circuits between a movable component and a stationary component. One end of the flex circuit is connected to the movable component that moves linearly up-and-down. The flex circuit strain relief routes the flex circuit away from the movable component and reroutes the flex circuit in a second direction to create a natural bend in the flex circuit as the flex circuit is rerouted for connection to a stationary component. As the movable member moved linearly up-and-down, the natural bend of the flex circuit rolls with the movement to reduce the stressed on the flex circuit during the movement.

12 Claims, 5 Drawing Sheets

STRAIN RELIEF FOR FLEXIBLE CIRCUIT

FIELD OF THE INVENTION

The present invention generally relates to flexible circuits and more specifically to a strain relief for a flexible circuit connected between a movable assembly and a stationary component.

PROBLEM

It is a problem in the field of flexible circuits to prevent bending the flexible circuit too sharply. A flexible circuit includes conductors or conductive traces between two flexible covers. The flexible covers are usually laminated to further protect the conductive traces. When the flexible circuit is bent too sharply, the layers on the outside of the bend are stretched and the layers on the inside of the bend are compressed.

Compression of the layers on the inside of the stressful bend can cause wrinkles in the lamination which may result in rippled conductors and delaminating of the cover on the inside of the stressful bend which may cause cracks in the flexible circuit. Delaminating or cracking of the cover on the inside of the stressful bend often leads to electrical circuit failure due to broken or fractured conductors within the flexible circuit. Stressful bend angles also cause the cover on the outside of the stressful bend to stretch which may lead to broken or fractured conductors or a torn cover.

Broken or fractured conductors are not easily detected by a visual inspection. Therefore, a failure may occur after a product has passed a visual inspection and is installed in the final assembly. Handling and vibration in final assembly can cause a flexible circuit having a stressful bend to be damaged leading to failure of the flex circuit.

Flexible circuits are used in a variety of designs wherein the flexible cable is routed from an initial position to an ending position to connect the two positions together. As the flexible cable is routed, the flexible cable may be bent around components, bent to interconnect two components together or may interconnect a moving component to a stationary component such as a printed circuit board. Movement of the moveable component may further bend the flexible cable to sharply, placing additional stress on the flexible cable at the location of the bend.

A typical data storage device includes a read/write head assembly for reading/writing data from/to a magnetic tape media as the magnetic tape media moves past the read/write head assembly. Data storage on tape media typically involves recording flux transitions in a series of narrow data tracks which are spaced closely together to maximize the amount of data that can be stored on a given length of tape media. To further maximize the amount of data that can be stored on the length of tape media, a plurality of parallel data tracks are recorded During the recording process, the tape media is moved past the read/write head as flux transitions are imparted in a thin line referred to as a data track. The read/write head is controllably positioned by a servo system to read/write data from/to each next data track. As the read/write head assembly moves up and down, one end of the flexible cable interconnecting the read/write head assembly to the printed circuit board also moves up and down. Thus, the flexible circuit provides an electrical interconnect with minimal constraint on movement of the read/write head assembly.

A U-shaped flexible cable guide is disclosed by Butler, et al. (U.S. Pat. No. 5,953,183) for use with a data storage device having a head assembly that reads/writes data from a rotating disk. The combination of a U-shaped flexible circuit guide and a removable snap-fit pin restrain the flexible circuit in a position defined by an inner surface of the cable guide between the cable guide and the removable snap-fit pin. The U-shaped flexible circuit guide routes the flex circuit to an electrical component on the side of an actuator body to substantially restrain the flex circuit as the read/write head moves horizontally to read/write data from/to the rotating disk.

While the flex clamp disclosed in Butler restrains a flex circuit attached to a horizontally movable member, it fails to provide a method for restraining a flex circuit attached to a movable member that moves linearly up-and-down. Nor does Butler route the flex circuit away from the movable member and in the direction of a stationary component. Instead, Butler merely restrains the flex circuit that interconnects the movable member to the stationary component. Butler also fails to provide a method for routing and restraining more than one flex circuit such that the flex circuits transition through a controlled bend wherein the controlled bend allows the flex circuit to find its own natural relaxed position by use of gravity and the natural tendency of the flex circuit to want to lie flat. Instead, the flex circuit in Butler is positioned vertically on one edge such that the natural tendency of the flex circuit to lie flat will cause the flex circuit to fold creating two uncontrolled bends in the flex circuit and therefore creating two stressful bends which may cause damage to the flex circuit and therefore failure of the data storage device.

What is needed is a flex circuit strain relief for controlling the location and the angle of the flexible circuit bend in a manner that the allows the flex circuit to naturally roll in a relaxed position during movement of the movable member and to route and restrain more than one flex circuit simultaneously.

SOLUTION

A flex circuit strain relief that routes and restrains multiple flex circuits that interconnect a movable component and a stationary component. One end of the flex circuit is connected to the movable component that moves linearly up-and-down. The flex circuit strain relief routes the flex circuit away from the movable component and reroutes the flex circuit in a second direction to create a natural bend in the flex circuit as the flex circuit is rerouted for connection to a stationary component. As the movable member moved linearly up-and-down, the natural bend of the flex circuit rolls with the movement to reduce the stress on the flex circuit during the movement.

The flex circuit strain relief includes a restraining member that attaches to the movable member and a corresponding removable clamp that mates with the restraining member as the flex circuit is routed first away from the movable member and then routed into the natural rolling bend before the other end of the flex circuit is connected to a stationary component. The restraining member includes an elongated guide portion that routes the flex circuit away from the movable component and a wing-shaped member cantilevered perpendicularly from the end of the elongated guide to route the flex circuit in a direction that allows the flex circuit to naturally bend prior to connection to the stationary component such that the natural bend rolls with the movement of the movable member.

The removable clamp includes a corresponding wing-shaped member that when attached to the restraining member by use of a first clip attaches the removable clamp to the restraining member to restrains the flex circuit through a stressful bend and reroute the flex circuit toward the natural rolling bend.

DETAILED DESCRIPTION

The flex circuit strain relief summarized above and defined by the enumerated claims may be better understood by referring to the following detailed description, which should be read in conjunction with the accompanying drawings. This detailed description of the preferred embodiment is not intended to limit the enumerated claims, but to serve as a particular example thereof. In addition, the phraseology and terminology employed herein is for the purpose of description, and not of limitation.

Data storage on tape media typically involves recording flux transitions in a series of narrow data tracks which are spaced closely together to maximize the amount of data that can be stored in a given length of tape media. During the recording process, the tape media is moved past the read/write head as flux transitions are imparted in a thin line referred to as a data track.

For linear recording tape devices, the data tracks have definite starting and stopping points. Normally, tape media motion continues in a straight line until the end of the tape media is reached and the tape media is stopped. This motion is referred to a single pass and for purposes of discussion will be defined to be in the horizontal direction. For the class of data storage devices under discussion, the read/write head is held still at a fixed vertical position during each pass while the tape media travels between a supply reel and a take up reel. Following a single pass, and while the tape media is stationary, the read/write head is moved perpendicularly to the next data track. Motion perpendicular to a recorded data track will be defined to be in the vertical, or linear, direction.

Before a recording pass, the read/write head is moved by an amount equal to one data track width and then held in that position for a complete horizontal pass of the tape media. Subsequently, tape media movement is stopped and restarted in the opposite direction. While the tape media direction is changed, the read/write head is brought into a new position. Writing begins again with one or more write heads positioned near the previously recorded data track or tracks.

A typical read/write head assembly includes at least one read head and at least one write head mounted on a drive head assembly. The read/write heads typically read and write data from and to the magnetic tape media as the magnetic tape media moves across the read/write head. The read head and the write head each require a flexible circuit for sending and receiving data to and from a circuit board for processing. When the read/write head completes a pass reading data from or writing data to the tape media, the drive head assembly moves the read/write head to the next data track. Therefore, during operation the drive head assembly moves the read/write head between a lower limit and an upper limit moving the tape head linearly up-and-down.

Figure 1:
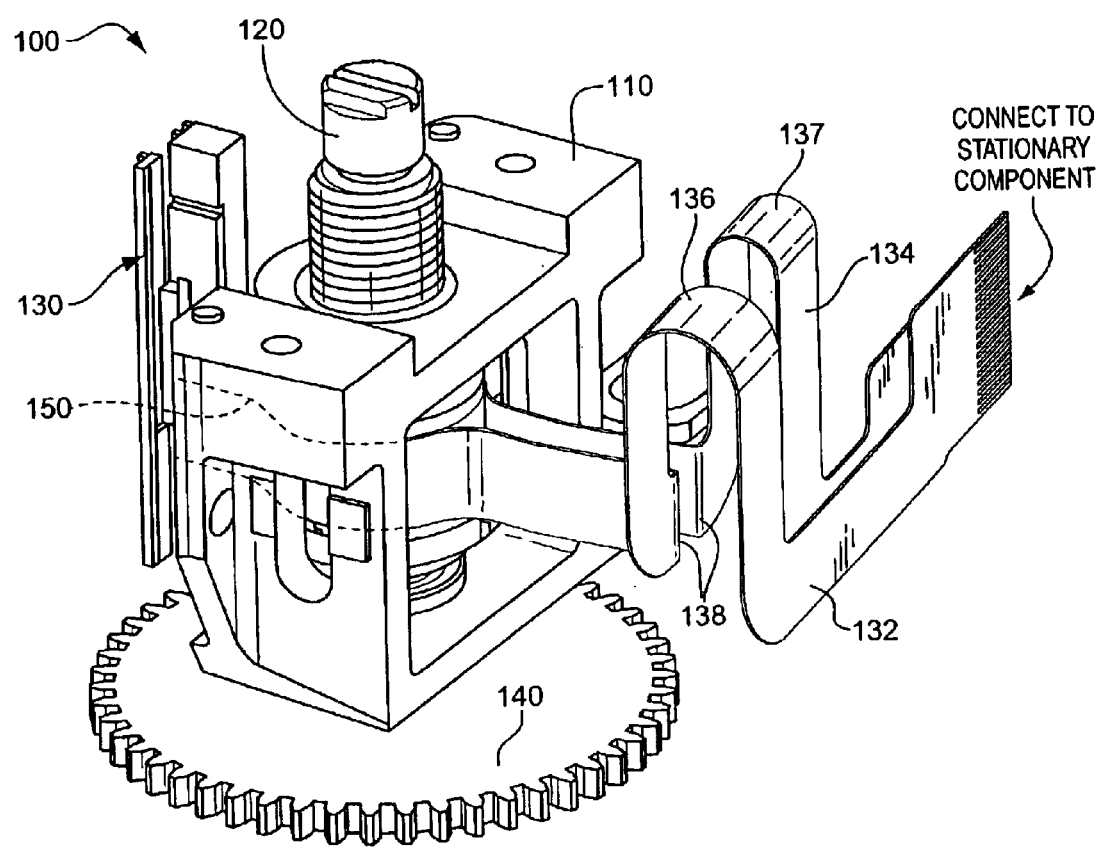
FIG. 1 illustrates a perspective view of two lengths of flexible circuit connected to and then routed away from a read/write head.

Referring to FIG. 1, the drive head assembly 100 includes a tape head body 110 on which is mounted the read/write head 130. The tape head body 110 also includes a drive mechanism for moving the tape head body 110, and therefore the read/write head 130, linearly up-and-down. The drive mechanism includes a drive gear 140 attached at one end of lead screw 120 which rotates to move tape head body 110 up-and-down according to the rotational directional of drive gear 140. The read and write flex circuits are routed through a hollow portion of tape head body 110 and around lead screw 120 as illustrated by the dashed line 150 in FIG. 1.

The shape of the flex circuit 132, 134 correspond to the routing required to route the flex circuit away from moving components toward a stationary component while also providing a bend 136, 137 of the flex circuit that "rolls" as the tape head body 110 moves up-and-down. The location and the angle of rolling bend 136, 137 is critical to the operation and the reliability of the drive head assembly 100. A stressful bend angle may cause the cover on the outside of the flex circuit to stretch or the cover on the inside of the flex circuit to wrinkle which may result in fractured conductors or a torn cover. Broken or fractured conductors with the cover are not easily seen by a visual inspection. Therefore, a failure may occur after a product has passed a visual inspection and is installed in the final assembly. Handling and vibration in final assembly can cause a flex circuit having a stressful bend to be damaged leading to failure of the flex circuit. Likewise, continued linear up-and-down movement of the drive head body during operation, and therefore movement of the flex circuit, may result in damage to the flex circuit leading to failure of the data storage device if the location and the angle of the bend is not controlled.

Referring back to FIG. 1, the read and write flex circuits 132 and 134 are first routed away from the tape head body 110 where the flex circuits 132, 134 encounter a first bend 138 that is substantially a ninety-degree angle with the read and write flex circuits routed in opposite directions parallel to the read/write head. To prevent the stressful ninety-degree bend 138 of the flex circuit 132, 134 from damaging the flex circuit and, therefore the conductors within the flex circuit, it is important to restrain the ninety-degree bend 138. The flex circuit is next routed upward and back downward to provide a second bend 136, 137 which rolls as the tape head body 110 moves linearly up-and-down. The read and write flex circuits 132, 134 are routing upward and allowed to naturally find their own natural relaxed position as the flex circuits bend back downward by the use of gravity and the tendency of the flex circuit to lie flat. Routing the flex circuit upward prevents the flex circuit from naturally bending in an uncontrolled direction by restraining the flex circuit only in the upward direction.

Figure 2:
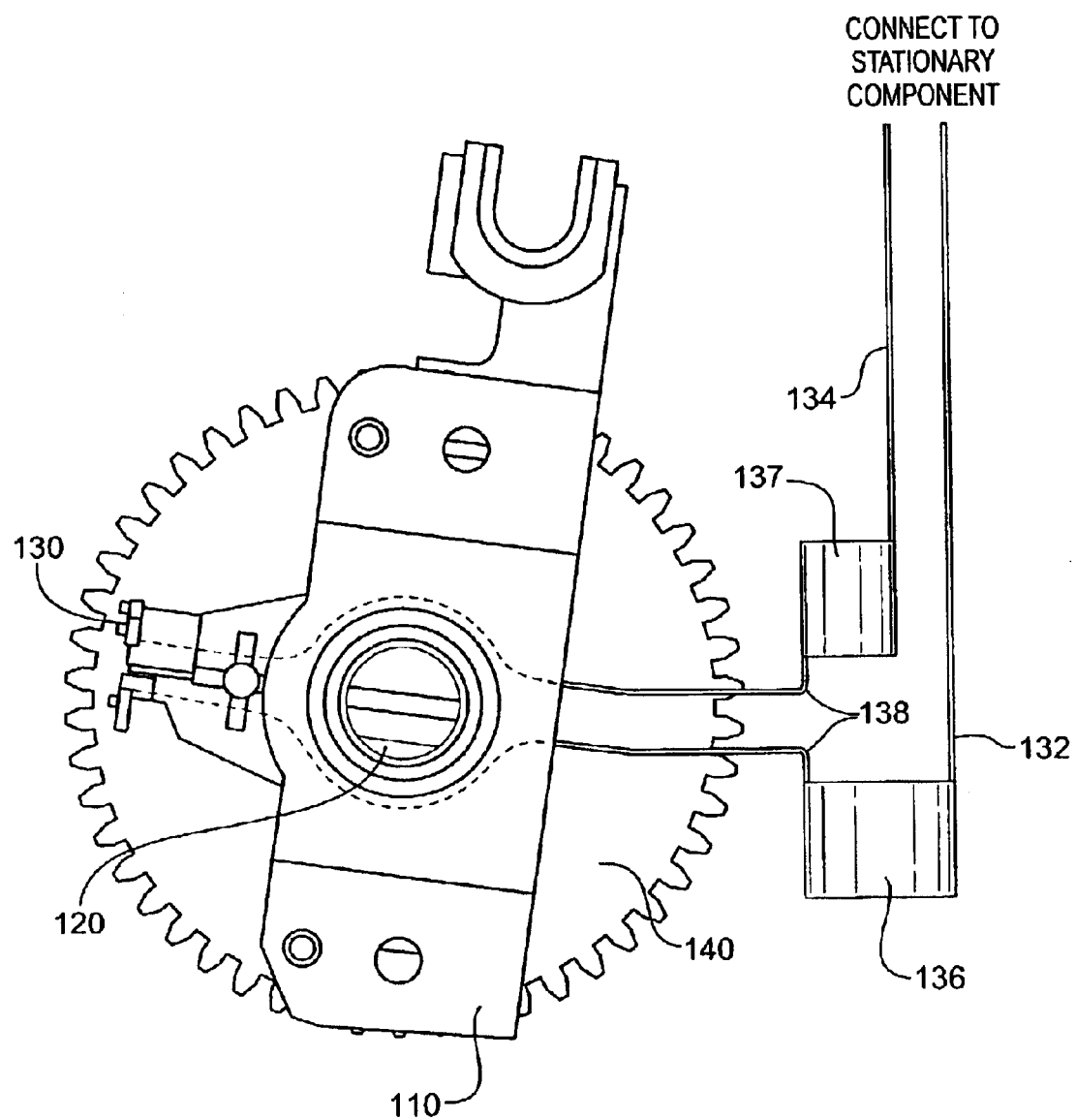
FIG. 2 illustrates a top view of the routing of the two lengths of flex circuit of FIG. 1.

FIG. 2 illustrates a top view of drive head assembly 100 and the routing of flex circuits 132, 134 as flex circuits 132, 134 are routed between the movable read/write head 130 and the stationary component as illustrated by the dashed lines within the tape head body 110.

Figure 3:
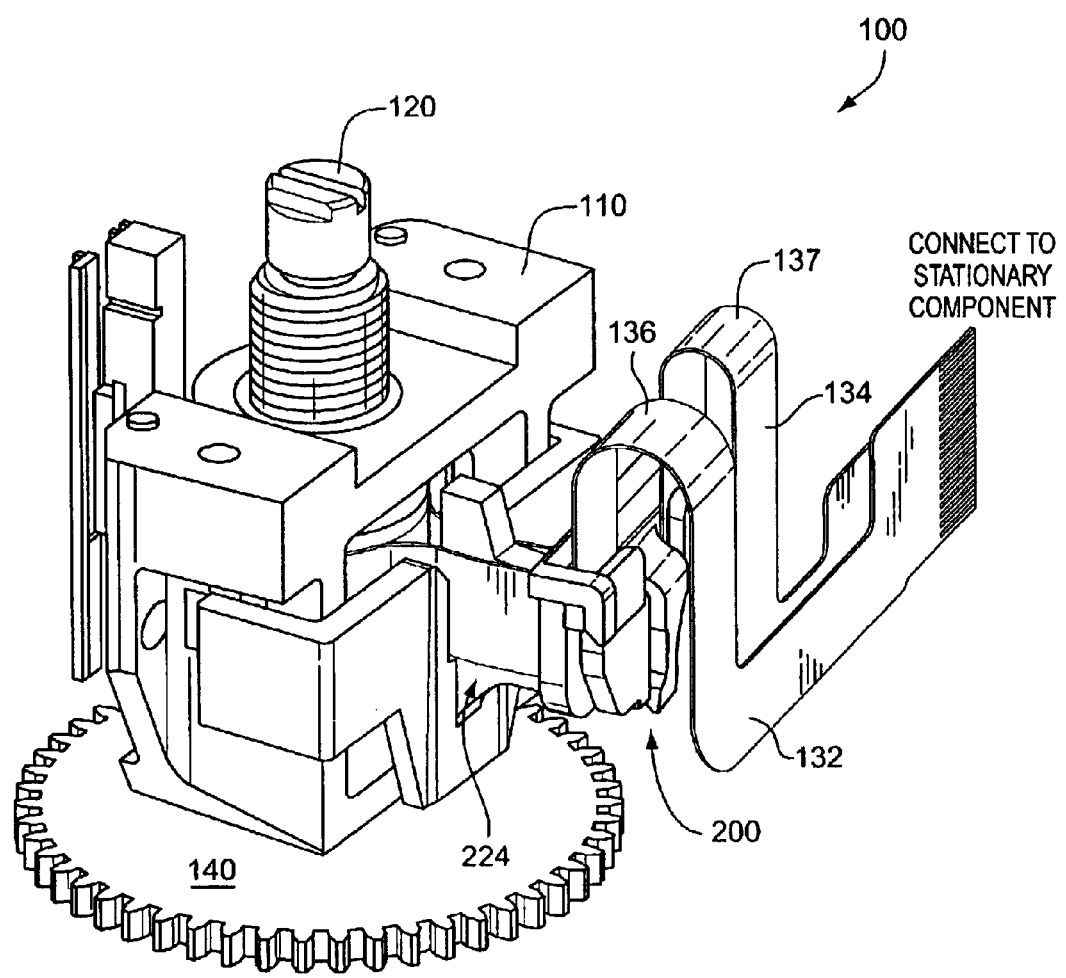
FIG. 3 illustrates a perspective view the two lengths of flex circuit of FIG. 1 routed and constrained using the present flex circuit strain relief.
Figure 4:
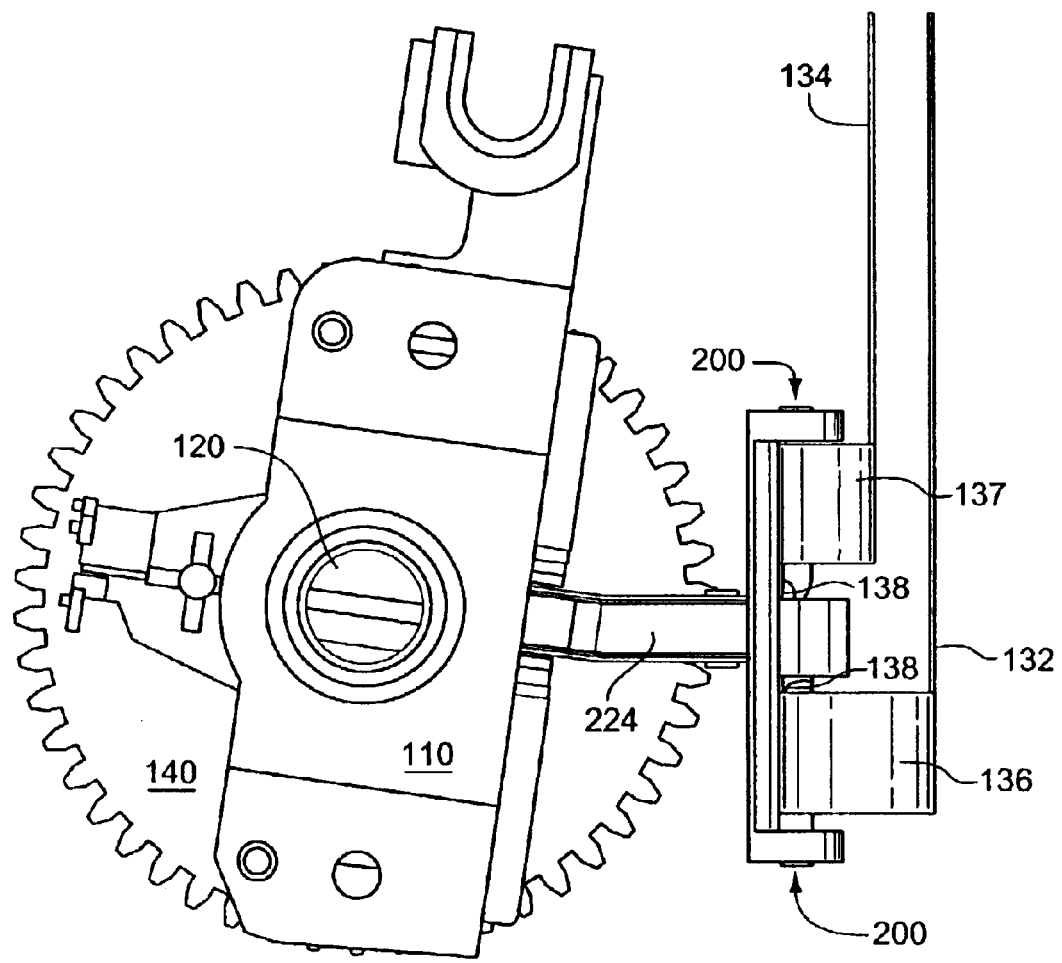
FIG. 4 illustrates a top view of the routing of the two lengths of flex circuit of FIG. 1 routed and constrained using the present flex circuit strain relief.

FIG. 3 illustrates the routing of read and write flex circuits 132, 134 of drive head assembly 100 as routed and constrained by the present flex circuit strain relief 200. The present flex circuit strain relief 200 routes the flex circuit away from the drive head body 110 following an elongated guide 224 of flex circuit strain relief 200. Flex circuit 132 is routed along a first side of elongated guide 224 while flex circuit 134 is routed along a second and opposite side of elongated guide 224. Referring to the top view of the drive head assembly 100 utilizing the present flex circuit strain relief 200 illustrated in FIG. 4, flex circuit strain relief 200 controls and constrains the ninety-degree bend 138 in read and write flex circuits 132 and 134 while also controlling the location and therefore the angle, of the rolling bends 136 and 137 in the read and write flex circuits 134 and 136 respectively.

Figure 5:
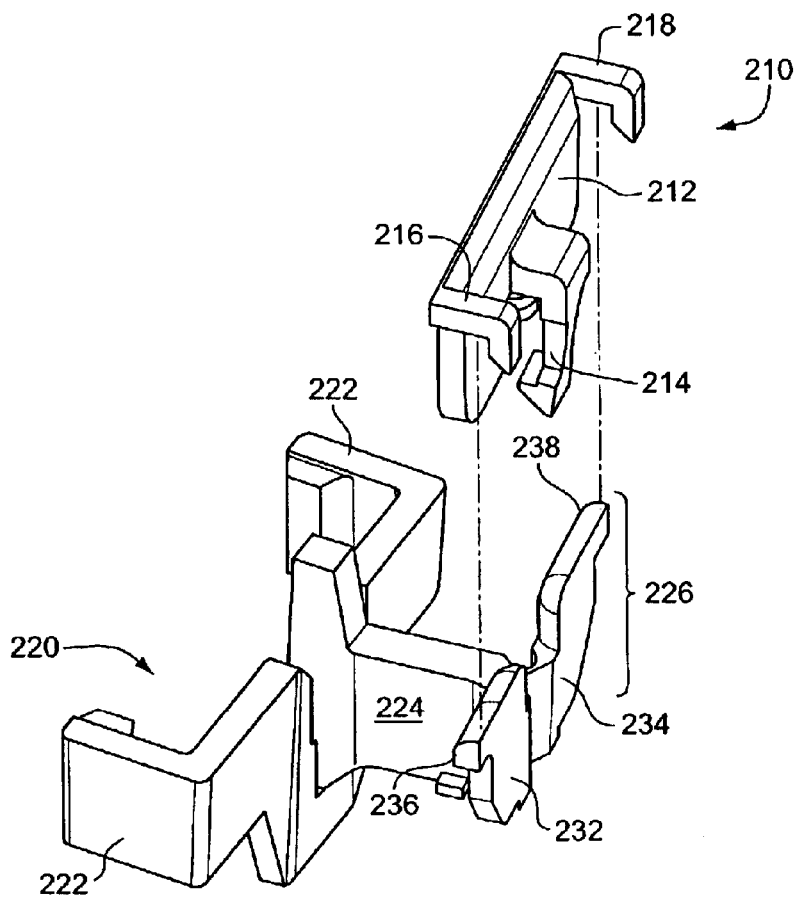
FIG. 5 illustrates a perspective view of the restraining member and the clamp comprising the present flex circuit strain relief in a disconnected position.

Referring to FIG. 5, the present flex circuit strain relief 200 comprises a restraining member 220 and an attachable clamp 210. Restraining member 220 includes an attaching member 222, a flat elongated guide 224 cantilevered from the attaching member 222, and a wing-shaped member 226 extending perpendicularly and centered at the end of the elongated guide 224. Referring to FIG. 5 in conjunction with FIG. 3, the read and write flex circuits 132 and 134 are routed from the read/write head 130 to the stationary component following the elongated guide 224 to route the read and write flex circuits 132 and 134 away from tape head body 110 where the two flex circuits 132, 1343 bend ninety-degrees in opposite directions following the first wing-shaped member 126. At the ninety-degree bends 138, one flex circuit 132 follows the first wing 232 while the other flex circuit 134 follows the second wing 234 in opposing directions on opposite sides of elongated guide 224. Due to the shape of the read and write flex circuits 132 and 134, the read and write flex circuits 132 and 134 are rerouted upwards away from drive gear 140 along the corresponding wing 232, 234 of wing-shaped member 226.

Figure 6:
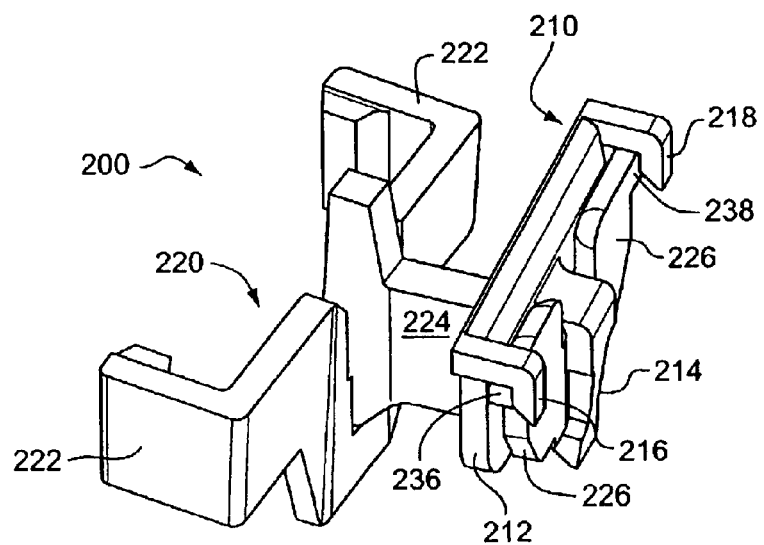
FIG. 6 illustrates a perspective view of the restraining member and the clamp comprising the present flex circuit strain relief in a connected position.

Removable clamp 210 mates with restraining member 220 to constrain read and write flex circuits 132 and 134. Removable clamp 210 includes a second wing-shaped member 212 which corresponds to first wing-shaped member 226 of restraining member 220 and a first clip 214 extending downward from the center of the wing-shaped member for attaching removable clamp 210 to restraining member 220. Referring to FIG. 6, removable clip 210 fits over restraining member 220 such that the first and second wing-shaped members 226 and 212 are adjacent with the first clip of removable clamp 210 extending over the first wing-shaped member 226 between the two wings of first wing-shaped member 226. Thus, attaching removable clamp 210 to restraining member 220. FIG. 3 illustrates the removable clamp 210 attached to restraining member 220 with read and write flex circuits 132 and 134 located between the first wing-shaped member 226 and second wing-shaped member 212 to retain the read and write flex circuits 132 and 134 as tape head body 110 moves linearly up-and-down.

Referring back to FIGS. 5 and 6, removable clamp 210 may also include a second and a third clip 216, 218, one at each end of wing-shaped member 212 for further restraining read and write flex circuits 132 and 134 between restraining member 220 and removable clamp 210. In this configuration, first wing-shaped member 226 includes two tabs 236 and 238 projecting outward from each side of wing-shaped member 226 such that second and third clips 216 and 218 of attaching clamp 210 clip over first and second tabs 236 and 238 of the first wing-shaped member as illustrated in FIG. 6.

With the read and write flex circuits 132 and 134 securely restrained by the present flex circuit strain relief, the remaining portion of the read and write flex circuits 132 and 134 that are extending upward from the top of the flex circuit strain relief 200, the flex circuit then bends downward parallel to tape head body 110 and wing-shaped members of flex circuit strain relief 200. Referring again to FIG. 3, the read and write flex circuits 132 and 134 illustrated is formed to direct the end of flex circuit 132, 134 toward a stationary component where the flex circuit terminates after the read and write flex circuits 132 and 134 bends downward.

Thus, the location of the flex circuit strain relief in relation to the movable and stationary components determines the angle and location of rolling bends 136 and 138 so that when tape head body 110 to which flex circuit strain relief 200 is attached moves linearly up-and-down during operation, the read and write flex circuits 132 and 134 bends 136 and 138 roll with the movement. Routing the flex circuit in the above-described manner reduces or eliminates the stress applied to the flex circuit in the area on the ninety-degree bend 138 and the rolling bends 136 and 138. It also removes any twisting of the flex circuit which might otherwise occur in the transitions of the of the flex circuit when the flex circuit is routed as illustrated in FIGS. 1 and 2.

The present flex circuit strain relief assures that the flex circuit will have a known radius of flex during operation, and therefore movement of the flex circuit, that will reduce the strain on the flex circuit bend. The location of the bend in the flex circuit is also controlled by the shape and placement of the flex circuit strain relief which provides predictable results on how the flex circuit will behave in actual use.

As to alternative embodiments, those skilled in the art will appreciate that the present flex circuit strain relief has been illustrated and described for use routing, and thus restraining, two flex circuits within a data storage device to control the angle and the location of the bend in the two flex circuits, alternative uses may be substituted. Similarly, while the peripheral devices described and illustrated includes a tape drive head assembly that is linearly movable up-and-down, the present flex circuit strain relief could be used to interconnect other movable and stationary components in an alternative direction.

It is apparent that there has been described, a flex circuit strain relief that fully satisfies the objects, aims, and advantages set forth above. While the flex circuit strain relief has been described in conjunction with specific embodiments thereof, it is evident that many alternatives, modifications, and/or variations can be devised by those skilled in the art in light of the foregoing description. Accordingly, this description is intended to embrace all such alternatives, modifications and variations as fall within the spirit and scope of the appended claims.

What is claimed is:

1. A flex circuit strain relief for interconnecting a length of flex circuit between a movable member and a stationary member, a first end of said length of flex circuit connected to said movable member, said flex circuit strain relief comprising:

a means for attaching said flex circuit strain relief to said movable member such that said length of flex circuit moves with a movement of said movable member;

a means for guiding said length of flex circuit away from said movable member;

a means for forming a first bend in said length of flex circuit along said guiding means to route said length of flex circuit in a first direction to create a flexible bend in said length of flex circuit for interconnecting said movable member and said stationary member; and a means for constraining said length of flex circuit as said length of flex circuit is routed between said movable member and said stationary member for controlling an angle and a location of said flexible bend in said length of flex circuit such that said length of flex circuit at said flexible bend rolls as said movable member moves said length of flex circuit between an initial position, and a second position; wherein said flexible bend is formed by naturally bending said length of flex circuit in an opposing second direction where a second end of said length of flex circuit is connected to said stationary member.

2. The flex circuit strain relief of claim 1, wherein said constraining means is attachable for constraining said length of flex circuit as said length of flex circuit is routed along said flex circuit strain relief.

3. A flex circuit strain relief for routing a length of flex circuit between a movable member and a stationary member, a first end of said length of flex circuit connected to said movable member, said length of flex circuit having a first portion and a second portion, said first portion located between said movable member and said second portion and said second portion located between said stationary member and said first portion, comprising:

a means for routing said length of flex circuit along said flex circuit strain relief wherein said routing of said length of flex circuit includes a rolling bend in said length of flex circuit, said routing means comprising:
  a means for attaching said flex circuit strain relief to said movable member;
  a means for guiding said first portion of said length of flex circuit away from said movable member, said guiding means comprising:
    a guiding member for guiding said first portion of said length of flex circuit away from said movable member; and
    a means for routing said second portion of said length of flex circuit in an upward direction for forming said rolling bend when said length of flex circuit is interconnected between said movable member and said stationary member;
  a means for securely restraining said length of flexible circuit as said length of flex circuit is routed a distance from said movable member; and
  a means for forming said rolling bend in said second portion of said length of said flex circuit for muting said second portion of said length of flex circuit toward said stationary member such that said flex circuit strain relief controls an angle and a location of said rolling bend such that said second portion of said flex circuit rolls as said movable member moves linearly up-and-down between an initial position and a second position.

4. The flex circuit strain relief of claim 3 wherein said securely restraining means comprises:
a corresponding means for guiding; and
a means for attaching integral to said corresponding guiding means for attaching said corresponding guiding means to said guiding means to securely restrain said first portion of said length of flex circuit as said length of flex circuit is routed between said movable member and said stationary member.

5. A flex circuit strain relief for use within a data storage device for routing a flex circuit between a drive head assembly including a read/write head and a stationary member, a first end of said flex circuit connected to said read/write head, the flex circuit strain relief comprising:

a restraining member connectable to said drive head assembly for routing said flex circuit between said read/write head and said stationary member; and an attachable clamp corresponding to said restraining member for mating with said restraining member to restrain said length-el flex circuit between said restraining member and said attachable clamp for routing said flex circuit to form a flexible bend between said restraining member and said stationary member.

6. The flex circuit strain relief of claim 5 wherein said restraining member comprises:
an elongated guide for routing said flex circuit away from said drive head assembly in a first direction; and
a first wing-shaped member perpendicularly extending from and centered at an end of said elongated guide extending outward on both sides of said elongated guide for rerouting said length of flex circuit in a second direction.

7. The flex circuit strain relief of claim 6 wherein said attachable clamp comprises:
a second wing-shaped member corresponding to said first wing-shaped member; and
a first clip extending downward parallel to said second wing-shaped member and outward a distance from said second wing-shaped member such that said first wing-shaped member fits between said second wing-shaped member and said first clip, wherein a length of said first clip is slightly longer than said first wing-shaped member for attaching said attachable clamp to said first wing-shaped member to secure said flex circuit to said restraining member.

8. A flex circuit strain relief for use within a data storage device for interconnecting a pair of flex circuits between a drive head assembly and a fixed member, a first end of said pair of flex circuits connected to a read/write head connected to said tape drive head assembly, comprising:

a restraining member for connecting said flexible circuit strain relief to said drive head assembly, comprising:
  an elongated guide cantilevered in a perpendicular direction away from said drive head assembly for routing said flex circuit away from said drive head assembly in a first direction; and
  a first wing-shaped member perpendicularly extending from and centered at an end of said elongated guide extending outward from said restraining member on both sides of said elongated guide for rerouting said length of flex circuit in a second direction; and an attachable clamp for mating with said restraining member comprising
  an second wing-shaped member corresponding to said first wing shaped member; and
  a first clip extending downward parallel to said second wing-shaped member a distance from said second wing-shaped member such that said first wing-shaped member fits between said second wing-shaped member and said first clip, wherein the length of said first clip is slightly longer than said first wing-shaped member for attaching said attachable clamp to said first wing-shaped member to secure said length of said flex circuit to said restraining member.

9. The flex circuit strain relief of claim 8, wherein said attachable clamp further comprises:

a second clip extending outward and downward from a first wing of said second wing-shaped member for attaching said first wing of said second wing-shaped member to a first wing of said first wing-shaped member; and a third clip extending outward and downward from a second wing of said second wing-shaped member for attaching said second wing of said second wing-shaped member to a second wing of said first wing-shaped member.

10. The flex circuit strain relief of claim 8, wherein said elongated guide comprises a first side and a second side and one of said pair of flex circuits routes along said first side and the other one of the pair of flex circuits routes along the second side.

11. The flex circuit strain relief of claim 8 wherein said first wing-shaped member comprises:

a first wing extending perpendicular from said first side of said elongated guide for routing a first one of said pair of flex circuits; and a second wing extending perpendicular from said second side of said elongated guide for routing said second one of said pair of flex circuits.

12. The flex circuit strain relief of claim 11 wherein said second wing-shaped member of said attachable member comprises:

a third wing on one side of said first clip, wherein the third wing corresponds with said first wing;

a fourth wing on the other side of said first clip, wherein the fourth wing corresponds with said second wing; and wherein said first clip attaches said first wing-shaped member to said second wing-shaped member with said length of flex circuit restrained between said first wing-shaped member to said second wing-shaped member.

\* \* \* \* \*